(12) United States Patent
Lee et al.

(10) Patent No.: US 8,068,363 B2
(45) Date of Patent: Nov. 29, 2011

(54) FLASH MEMORY APPARATUS AND READ OPERATION CONTROL METHOD THEREFOR

(75) Inventors: Myung Suk Lee, Gyeonggi-do (KR); Jeong Soon Kwak, Gyeonggi-do (KR); Do Hee Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 106 days.

(21) Appl. No.: 12/494,491

(22) Filed: Jun. 30, 2009

(65) Prior Publication Data

US 2010/0165732 A1 Jul. 1, 2010

(30) Foreign Application Priority Data

Dec. 30, 2008 (KR) .................. 10-2008-0136385

(51) Int. Cl.
*G11C 11/34* (2006.01)
*G11C 7/00* (2006.01)

(52) U.S. Cl. ............... 365/185.11; 365/185.33; 365/200

(58) Field of Classification Search ............. 365/185.11, 365/185.18, 185.33, 200
See application file for complete search history.

(56) References Cited

U.S. PATENT DOCUMENTS

| 5,970,022 A | 10/1999 | Hoang |
| 2002/0075728 A1 * | 6/2002 | Mokhlesi .................. 365/185.33 |
| 2006/0149896 A1 * | 7/2006 | Chang et al. .................. 711/103 |
| 2008/0104308 A1 * | 5/2008 | Mo et al. ........................ 711/103 |
| 2008/0181018 A1 * | 7/2008 | Nagadomi et al. ....... 365/185.25 |
| 2008/0244340 A1 * | 10/2008 | Doi ................................ 714/711 |
| 2008/0282025 A1 * | 11/2008 | Biswas et al. .................. 711/103 |
| 2008/0316822 A1 | 12/2008 | Ahn et al. |
| 2009/0003080 A1 | 1/2009 | Noh |
| 2009/0052257 A1 | 2/2009 | Park et al. |
| 2009/0172254 A1 * | 7/2009 | Chen .............................. 711/103 |
| 2009/0193174 A1 * | 7/2009 | Reid ............................. 711/100 |
| 2009/0216936 A1 * | 8/2009 | Chu et al. ...................... 711/103 |

FOREIGN PATENT DOCUMENTS

| JP | 2003-157685 A | 5/2003 |
| JP | 2003-217288 A | 7/2003 |
| JP | 2008-226422 A | 9/2008 |

* cited by examiner

*Primary Examiner* — VanThu Nguyen
*Assistant Examiner* — Khamdan Alrobaie
(74) *Attorney, Agent, or Firm* — Ladas & Parry LLP

(57) ABSTRACT

A flash memory apparatus of an embodiment is configured to include a flash memory including a plurality of blocks and a read operation control circuit determining whether to replace a block in accordance with the number of times a read process is performed for each block of the plurality of blocks.

13 Claims, 4 Drawing Sheets

FLASH MEMORY APPARATUS AND READ OPERATION CONTROL METHOD THEREFOR

CROSS-REFERENCES TO RELATED PATENT APPLICATION

The present application claims priority under 35 U.S.C 119(a) to Korean Application No. 10-2008-0136385, filed on Dec. 30, 2008, in the Korean Intellectual Property Office, which is incorporated herein by reference in its entirety as set forth in full.

BACKGROUND

1. Technical Field

The embodiment described herein relates generally to a semiconductor memory apparatus, and more particularly to a flash memory apparatus and read operation control circuit, and method therefor.

2. Related Art

In general, flash memories are composed of a plurality of blocks and each of the blocks is composed of a plurality of pages. Further, read and write operations are performed in a page unit and an erasing operation is performed in a block unit.

In flash memory a corresponding page must be erased before data is recorded, and therefore recording data directly to the flash memories by using a data address generated from an application can cause failure.

FIG. 1 is a block diagram showing the configuration of a common flash memory apparatus.

As shown in the figure, a flash memory apparatus is configured to include a flash memory 10, an application 12 (e.g., a user program requesting a predetermined data calculation), a control unit 14 allowing data calculation to be executed in the flash memory 10 in accordance with the request of the application 12, and a driver 16 performing physical access to the flash memory 10.

In the configuration shown in FIG. 1, the control unit 14 is configured to include a file system 142 and Flash Translation Layer (FTL) 144.

The file system 142 manages files and directories to provide a user with more efficient storage device environment.

The FTL 144 allows the flash memory 10 to be used as a virtual block device, and therefore performs a function of mapping an address, that is, the FTL 144 converts a logic address transmitted from the application 12 into a physical address that is used in the flash memory 10.

Further, the FTL 144 performs a function of wear-leveling. As described above, the flash memory 10 cannot overwrite data, the existing data must be erased before performing a write operation. Over time, performing the erasing operating can deteriorate a flash memory, and when the erasing operation is performed more than a predetermined number of times, the corresponding block can no longer be used. Therefore, to extend the life span of a flash memory the erasing operation should be uniformly performed throughout the blocks of the flash memory, which can be achieved through wear-leveling. The FTL 144 manages the number of erasures for each block. Further, the FTL 144 allows the flash memory to sufficiently function as a disc by transferring data stored in blocks where the erasing operation has been performed many times to blocks where the erasing operation has not been performed as many times.

Small electronic devices, such as MP3 players, portable game machines, mobile communication terminals and the like commonly use Flash memories.

Small portable electronic devices, such as MP3 players, are not typically used for recording data in a memory, but rather the small portable electronic devices are used for repeatedly reading recorded data. Such repeated read operation of a memory causes electric current leakage and influences adjacent cells that a hot carrier did not access due to repeated read operations.

In flash memories, performing a write operation requires the application of a voltage of at least a predetermined level. In the flash memory, when repeatedly performing the read operation for a specific page, the voltages of the adjacent cells can increase by a predetermined level due to the hot carrier generated by the repeated read operation, which can bring the same result as writing data in the corresponding adjacent cells.

As a result, conventionally the data stored in a flash memory can be changed to an undesired value resulting in reading the wrong data in a later reading operation when repeatedly performing the read operation as described above.

SUMMARY

The present invention includes a flash memory apparatus capable of minimizing influence of a repeated read operation on adjacent cells and a method of controlling the read operation.

Also, the present invention improves the operational reliability of a flash memory apparatus by replacing a block where a read operation is repeated with a spare block.

In one aspect, a flash memory apparatus includes a flash memory including a plurality of blocks; and a read operation control unit that determines whether to replace the blocks, in accordance with the read number of times of each of the blocks.

In another aspect, a method of controlling a read operation of a flash memory apparatus including a plurality of blocks, which includes counting the read number of times of a block where an read operation is performed, as a read command is inputted; comparing the read number of times with a predetermined maximum repeated read number of times; and replacing the block when the read number of times exceeds the maximum repeated read number of times.

These and other features, aspects, and embodiments are described below in the period "Detailed Description."

BRIEF DESCRIPTION OF THE DRAWINGS

Features, aspects, and embodiments are described in conjunction with the attached drawings, in which.

DETAILED DESCRIPTION

Hereinafter, preferred embodiments will be described in detail with reference to the accompanying drawings.

Figure 1:
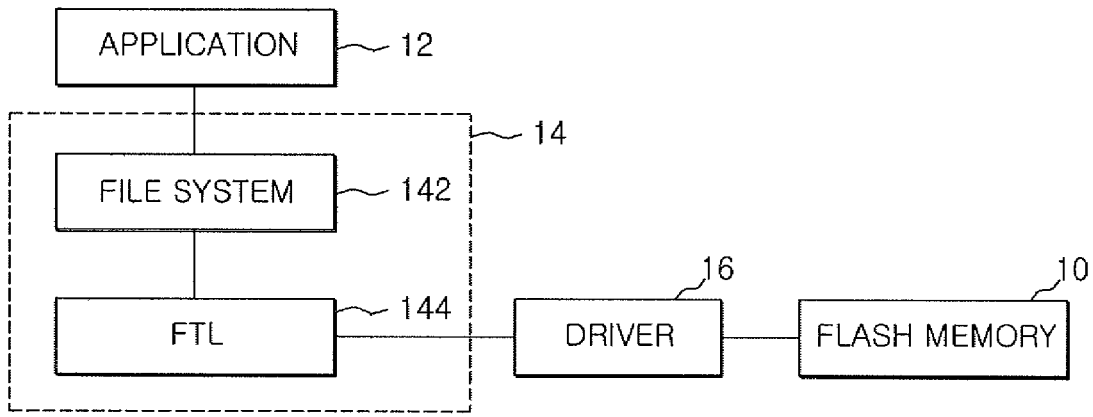
FIG. 1 is a block diagram showing a common flash memory apparatus.
Figure 2:
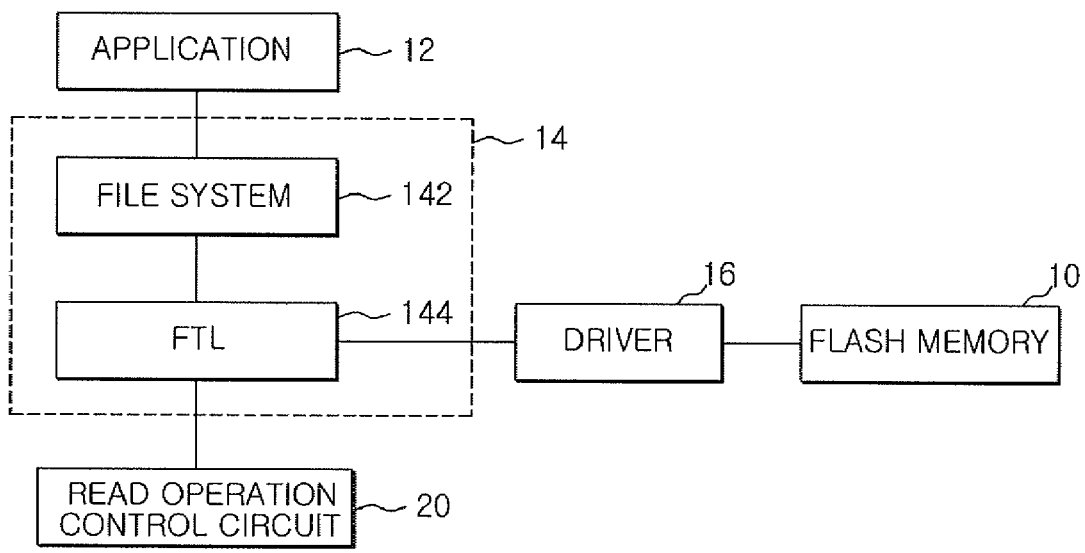
FIG. 2 is a block diagram showing a flash memory apparatus according to an embodiment of the present invention.

FIG. 2 is a block diagram showing a flash memory apparatus according to an embodiment of the present invention.

As shown in FIG. 2, a flash memory apparatus according to an embodiment of the present invention can include a read operation control circuit 20 that determines whether to replace a block in accordance with the number of times a data block of a flash memory 10 is read and request a control unit 14 to replace the block, if replacement is needed.

The flash memory 10 includes a plurality of data blocks and an application 12 that is a user program requesting predetermined data calculation. Meanwhile, the control unit 14 controls the flash memory 10 to perform data calculation in accordance with request of the application 12. Further, a driver 16 performs physical access to the flash memory 10.

More specifically, the read operation control unit 20 determines in advance the maximum repetition number of times read 'Nrd_max' for the data blocks, and when the number of times read 'Nrd' of a specific data block exceeds the maximum repetition number of times read 'Nrd_max', the read operation control unit 20 replaces the data block with another data block.

For this operation, a counter map that manages the number of times read Nrd is created and stored in a predetermined region of the flash memory 10.

When the operation for using the flash memory 10 starts, the counter map stored in the flash memory 10 is loaded to a cache memory. When a read operation is repeated with respect to a specific block, the number of times read Nrd is stored in the counter map to be matched with the address of the block.

Through this, it is possible to manage the address and the number of times read Nrd with respect to each of the blocks of a flash memory. Therefore, according to an embodiment of the present invention, storing the number of times read Nrd of blocks that are accessed for the read operation into the counter map is made more efficient in terms of saving resources.

Figure 3:
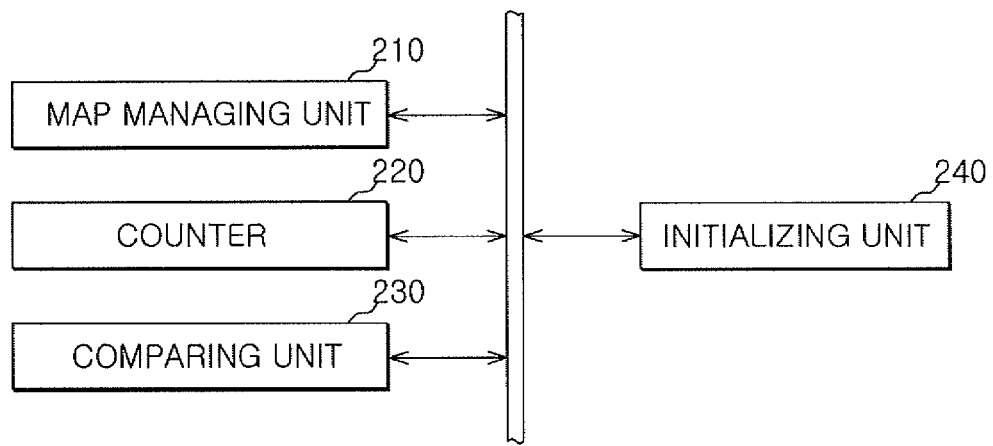
FIG. 3 is a block diagram showing a configuration of the read operation control circuit shown in FIG. 2.

FIG. 3 is a block diagram showing a configuration of the read operation control circuit shown in FIG. 2.

As shown in FIG. 3, the read operation control circuit 20 is configured to include a map managing unit 210, a counter 220, a comparing unit 230, and an initializing unit 240.

The map managing unit 210 stores the number of times read Nrd of a data block where a read operation is repeated. For this, a storage region is allocated in the flash memory 10 and the counter map is initialized. As the flash memory starts the operation, the counter map stored in the flash memory 10 is loaded to the cache memory and the data of the counter map loaded to the cache memory is stored in a flash memory 10 in a predetermined cycle.

Figure 4:
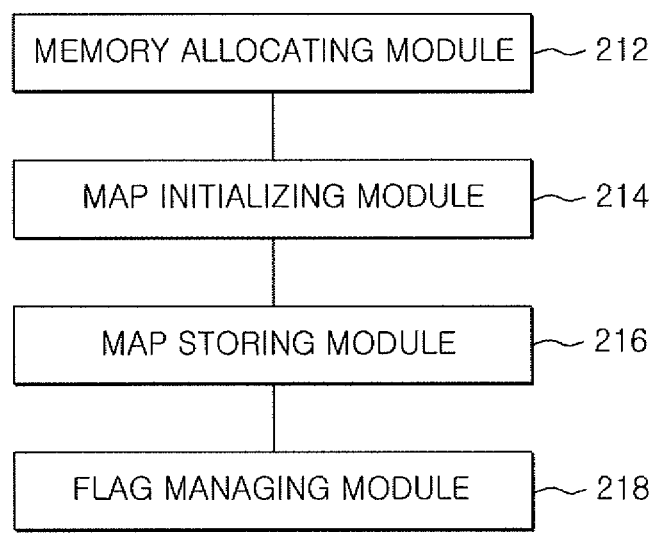
FIG. 4 is a block diagram showing a configuration of the map managing unit shown in FIG. 3.

FIG. 4 is a block diagram showing a configuration of the map managing unit shown in FIG. 3.

As shown in FIG. 4, the map managing unit 210 can include a memory allocating module 212, a map initializing module 214, and a map storing module 216, and may further include a flag managing module 218.

The memory allocating module 212 allocates a specific region of the flash memory 10 to store the counter map, and the map initializing module 214 initializes the counter map early in the operation of the flash memory 10.

The map storing module 216 stores the counter map into a predetermined allocated region of the flash memory 10 by erasing the previous data and performing a writing operation, when the counter map residing in the cache memory is renewed as the flash memory apparatus starts the operation and then stored in the flash memory 10 in a predetermined cycle. According to an embodiment of the present invention, it is preferable that the map storing module 216 arranges the addresses of the data blocks according to the number of times read 'Nrd'.

The flag managing module 218 manages whether to replace the data block where the counter map is stored, with reference to a flag. In order for the map storing module 216 to store the counter map into the flash memory 10, the previous data must be erased. As described above, in the flash memory 10 when the erasing operation has been performed over a predetermined number of times in a data block, that data block can no longer be used.

Accordingly, in order to prevent the corresponding data block from becoming useless due to repetition of the erasing operation, the wear-leveling function of the FTL 144 is used. That is, a flag is set to a predetermined value (e.g. '0') at a prior stage, the number of times erasing 'Ner' is accumulated every time the counter map is stored. Further, when the accumulated number of times erasing exceeds a predetermined maximum number of times erasing 'Ner_max', the flag is, for example, changed into '1' so that block can be replaced in the next erasing operation. The predetermined maximum number of times erasing 'Ner_max' can be set to the number of times that prevents the corresponding data block from becoming damaged and therefore useless.

The counter map can manage the counting of the number of times of the read operation for the addresses of all the data blocks, however, in order to prevent the waste of the memory, it is preferable to manage the read number of times for the data blocks that are accessed for the read operation.

The configuration of the read operation control circuit 20 according to an embodiment is described with reference to FIG. 3.

The counter 220 counts and stores the number of times a data block is read in the counter map, as a read command is inputted.

The comparing unit 230 checks whether the number of times read 'Nrd' counted by the counter 220 exceeds the predetermined maximum repeated number of times read 'Nrd_max', and then, if the number of times read Nrd exceeds the maximum repeated number of times Nrd_max, the comparing unit 230 requests for the control unit 14 to replace the block. The maximum repeated read number of times 'Nrd_max' can be set to a number of times that does not influence adjacent cells after undergoing a read test process for the flash memory 10.

When the number of times read 'Nrd' of a specific block exceeds the maximum repeated number of times read 'Nrd_max' the block is replaced, and then the initializing unit 240 resets the number of times read 'Nrd' of the data block where data before the block is replaced has been stored.

As described above, according to an embodiment of the present invention, the maximum repeated number of times read 'Nrd_max' is predetermined, and when the number of times read 'Nrd' of a specific data block meets the maximum repeated number of times read 'Nrd_max', no additional read operations are performed in the corresponding data block.

Therefore, according to an embodiment of the present invention it is possible to prevent the data of adjacent cells from changing by hot carriers generated by repetition of the read operation in a data block.

Figure 5:
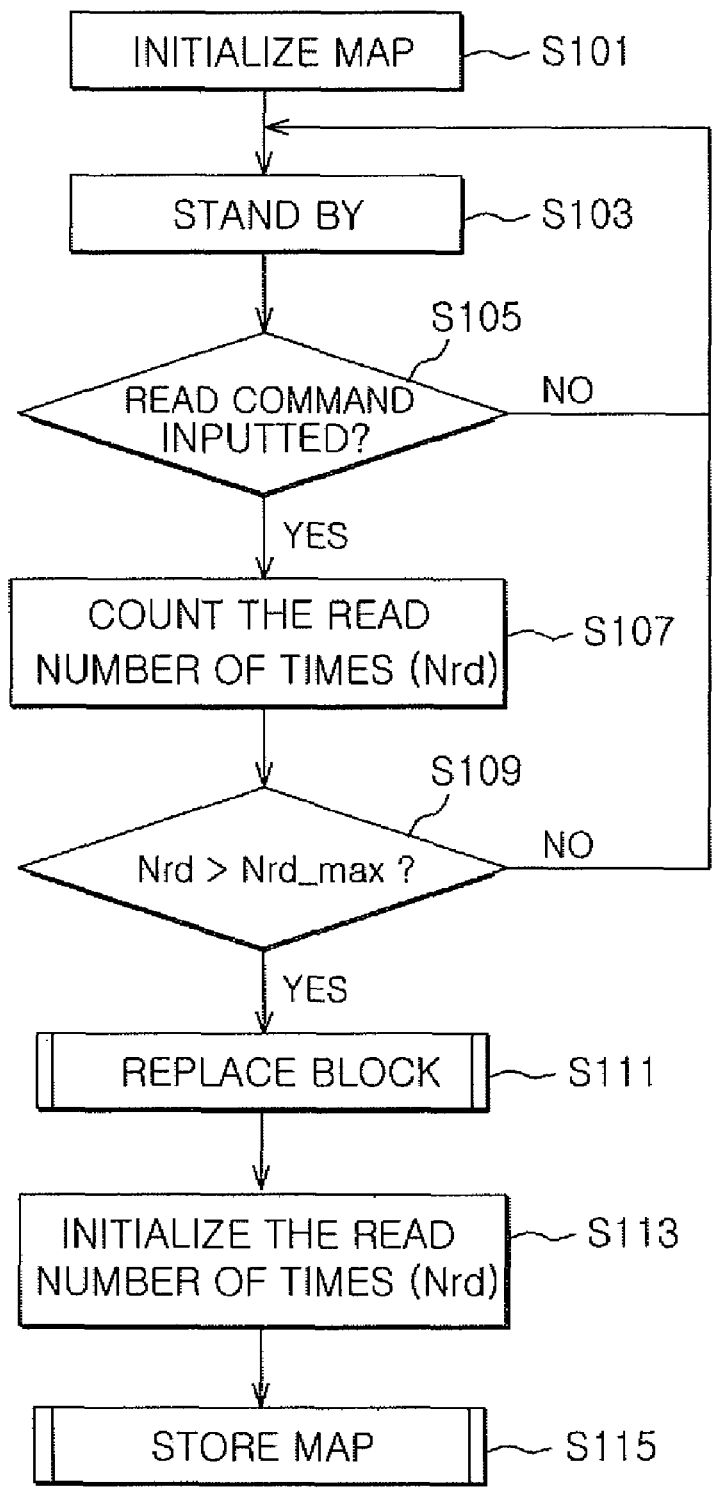
FIG. 5 is a flowchart shown for illustrating a read operation control method according to an embodiment of the present invention.

FIG. 5 is a flowchart shown for illustrating a read operation control method according to an embodiment of the present invention.

In order to count the number of times a specific data block is read, i.e., the number or times read Nrd, the map managing unit 210 first allocates a specific region of the flash memory 10 as a map storage region, and subsequently creates and initializes the counter map (S101).

As the flash memory apparatus starts the operation after the counter map is initialized as described above, the flash memory 10 maintains a stand-by state until a command is inputted from the control unit 14 (S103).

As a read command is inputted (S105), the counter 220 counts the number of read commands inputted for a corresponding data block with reference to the address included in the read command, and then stores the counted number of times into the counter map (S107). It will be understood by one having skill in the art that the address of the data block that will perform the read command can be a logic address or a physical address changed by the FTL 144.

Subsequently, the comparing unit 230 compares the predetermined maximum repeated number of times read 'Nrd_max' with the number of times read Nrd counted in Step S107 (S109).

As a result of the comparison in Step S109, when the number of times read 'Nrd' exceeds the maximum repeated number of times read 'Nrd_max', the comparing unit 230 requests the FTL 144 of control unit 14 to replace the block (S111).

After the block is replaced by the FTL 144, the initializing unit 240 accesses the counter map and resets the number of times read 'Nrd' of the data block where the read operation was repeated before the block was replaced (S113), and the map managing unit 210 stores the renewed counter map (S115).

Figure 6:
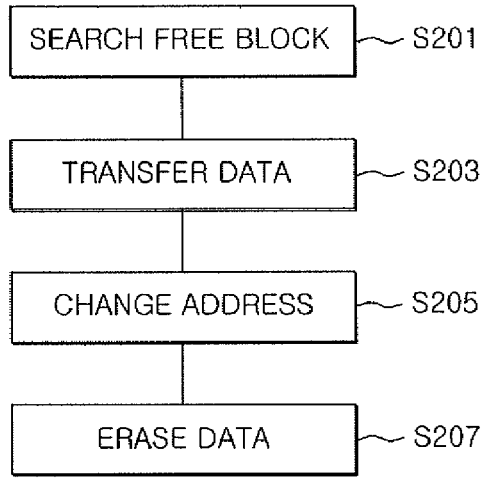
FIG. 6 is a flowchart shown for illustrating the block replacement process shown in FIG. 5.

FIG. 6 is a flowchart shown for illustrating the block replacement process shown in FIG. 5.

The FTL 144 of the flash memory apparatus performs the wear-leveling function.

According to an embodiment of the present invention, block replacement is performed for a data block on which the read operation has been performed as many as the predetermined maximum repeated number of times read 'Nrd_max' according to requests of the read operation control circuit 20, which is described in detail hereafter.

First, the FTL 144 determines whether a free block to copy data exists (S201).

Typically, flash memory 10 is divided into a map region, a log region, a data region, and a spare region. The map region is a portion where an address mapping table is stored. The log region is a portion where data read/write is performed prior to the data region. The data region is a region where the data stored in the log region is transferred and stored, when no free block exists in the log region.

Accordingly, the FTL 144 searches for free blocks existing in the log region and stores the data in the data block where the number of times read 'Nrd' exceeds the maximum repeated number of times read 'Nrd_max' into a free block found upon searching the log region (S203).

Thus, since the data storage region has been changed, the FTL 144 accesses the address mapping table and changes the address (S205), and the FTL 144 performs the erasing operation for the data block where the number of times read 'Nrd' exceeds the maximum repeated number of times read 'Nrd_max' (S207).

The process of block replacement by the FTL 144, i.e., the process of transferring data and changing and erasing the address, is commonly performed in a system using a flash memory, which is not limited to the above. That is, it should be understood by one having skill in the art that the process is performed by various processes of block displacement of the flash memory apparatus.

According to an embodiment of the present invention, the counter map having the result of counting the number of times read 'Nrd' stored therein is stored in the flash memory 10 in a predetermined cycle.

In order to store data in the flash memory 10, first the previous data should be erased, and the corresponding block having the date therein erased cannot be used when the number of times erasing 'Ner' exceeds a predetermined number.

Therefore, in accordance with the accumulated number of times erasing 'Ner' for the data block where the counter map is stored, it is possible to replace the data block where the counter map is stored with another data block when the number of times erasing 'Ner' of the corresponding data block exceeds the predetermined maximum number of times erasing 'Ner_max'.

Figure 7:
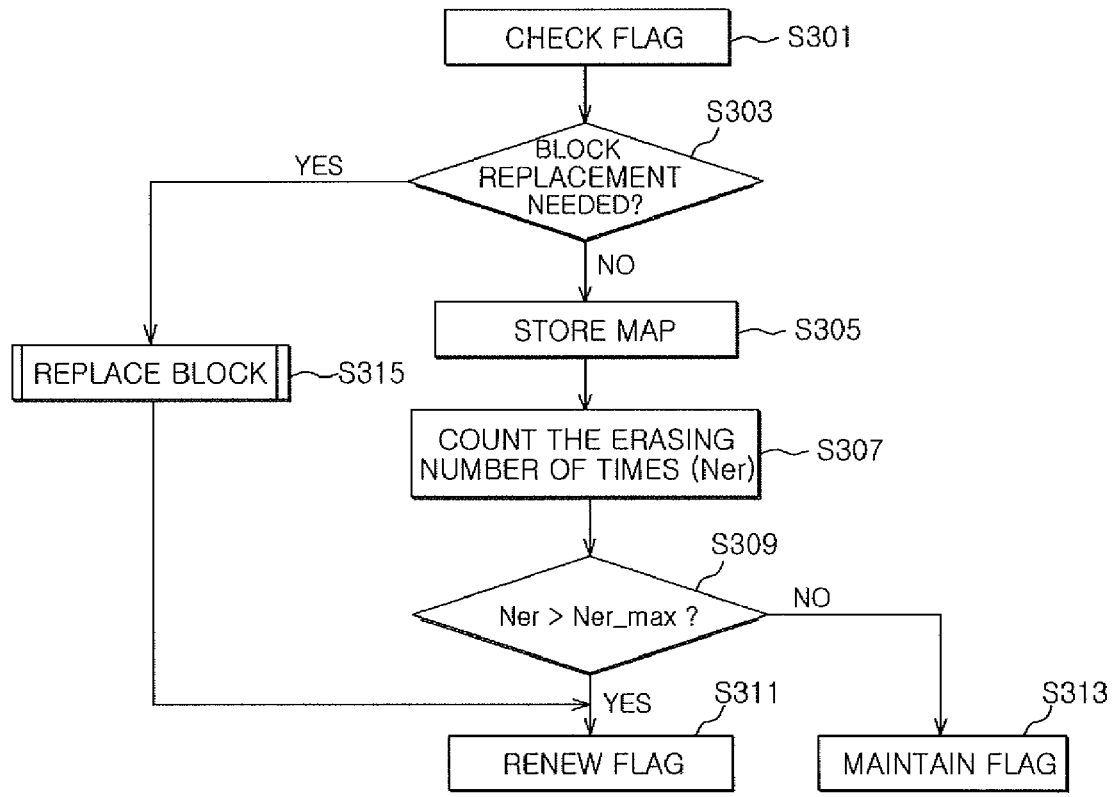
FIG. 7 is a flowchart shown for illustrating the map storage process shown in FIG. 5.

FIG. 7 is a flowchart shown for illustrating the map storage process shown in FIG. 5.

In order to store the counter map, the map managing unit 210 determines whether to replace a block in accordance with the accumulated number of times erasing 'Ner' as a flag.

Through this, the flag managing module 218 checks the flag (S301) before storing the counter map, and then checks whether the data block where the counter map will be stored needs to be replaced (S303).

When the block does not need to be replaced, the counter map is stored by the map storing module 216 (S305) and the corresponding number of times erasing 'Ner' is counted (S307).

The counter 207 compares the number of times erasing 'Ner' counted in Step S307 with the maximum number of times erasing 'Ner_max' to determine whether the number of times erasing 'Ner' exceeds the maximum number of times erasing 'Ner_max' (S309), and when the number of times erasing Ner exceeds the maximum number of times erasing Ner_max, the flag is renewed (S311), otherwise, the previous flag is maintained (S313).

In the alternative, as a result of Step 5303, when it is determined that the block needs to be replaced, for example, the process of block replacement is performed by a block replacement algorithm of the FTL 144 as shown in FIG. 6 (S315). Further, as block replacement is performed, the flag of the block where the corresponding counter map is stored is renewed (S311).

In this operation, it is preferable that the FTL 144 replaces the block where the counter map is stored by selecting a free block having a small number of erasures, in accordance with the wear-leveling function.

In the process of block replacement for storing the counter map, data is also first stored in the log region and then the counter map can be transferred to the data region.

Further, in block replacement due to repetition of the read operation, or in replacement of data block where the counter map is stored, a process of merging blocks can accompany for the log region, and in this process, the FTL 144 counts the number of times erasing for each block in accordance with the wear-leveling.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A flash memory apparatus, comprising:
a flash memory having a plurality of blocks; and
a read operation control unit configured to determine whether to replace a block among the plurality of blocks according to a number of times of the block is read,
wherein the read operation control unit comprises a map managing unit configured to create and renew a counter map, storing the number of times a block is read in the counter map, and excluding from the counter map blocks that have not been read,
and wherein the map managing unit arranges addresses of the blocks according to the number of times the blocks are read.

2. The flash memory apparatus according to claim 1, wherein the read operation control unit further comprises:
a counter configured to count the number of times the block is read in accordance with a read command, and store the address of the block and the counted number of times the block is read into the counter map; and
a comparing unit configured to determine whether to replace the block, by comparing the counted number of times the block is read with a predetermined maximum number of times.

3. The flash memory apparatus according to claim 2, further comprising a flash translation layer configured to replace the block in accordance with a request of the read operation control unit.

4. The flash memory apparatus according to claim 2, wherein the read operation control unit further comprises an initializing unit configured to reset the counted number of times the block is read before being replaced as the block is replaced by a replaced block.

5. The flash memory apparatus according to claim 2, wherein the map managing unit comprises:
a memory allocating module configured to allocate an allocated block among the plurality of blocks for storing the counter map;
a map initializing module configured to initialize the counter map; and
a map storing module configured to store the counter map in the allocated block, as the counter map is renewed.

6. The flash memory apparatus according to claim 5, wherein the map managing unit further comprises a flag managing module configured to determine whether to replace the allocated block according to a flag.

7. The flash memory apparatus according to claim 6, wherein the map storing module stores the counter map in one of the allocated block and the replaced block according to the flag.

8. A method of controlling a read operation of a flash memory apparatus having a plurality of blocks, the method comprising:
creating a counter map;
counting the number of times a read operation is performed on a block, as a read command is inputted;
storing the number of times the read operation is performed on the block in the counter map, and excluding from the counter map blocks that have not been read;
comparing the number of times the read operation is performed with a predetermined maximum number of times;
replacing the block with a replaced block when the number of times the read operation is performed exceeds the maximum number of times; and
arranging addresses of the blocks according to the number of times the blocks are read.

9. The method of controlling a read operation of a flash memory apparatus according to claim 8, further comprising after replacing the block with the replaced block, resetting the number of times the read operation is performed before the block replaced.

10. The method of controlling a read operation of a flash memory apparatus according to claim 9, wherein the replacing of a block comprises:
searching for a free block in the plurality of blocks;
storing data of a block where the number of times the read operation is performed exceeds the maximum number of times into the searched free block;
changing the address information in accordance with the address of the replaced block; and
erasing the data stored in the block before the block is replaced.

11. The method of controlling a read operation of a flash memory apparatus according to claim 10, further comprising storing the counter map after replacing the block.

12. The method of controlling a read operation of a flash memory apparatus according to claim 11, wherein the storing of the counter map comprises:
counting the number of times an erasing operation is performed for the block where the counter map is stored;
comparing the number of times the erasing operation is performed with a predetermined maximum number of erasures; and
replacing a block for storing the counter map, when number of times the erasing operation is performed exceeds the predetermined maximum number of erasures.

13. The method of controlling a read operation of a flash memory apparatus according to claim 8, wherein storing the number of times the read operation is performed on the block in the counter map further comprises:
storing the address of the block in the counter map.

* * * * *